(12) United States Patent
Wu et al.

(10) Patent No.: US 11,908,679 B2
(45) Date of Patent: Feb. 20, 2024

(54) ATOMIC OXYGEN AND OZONE DEVICE FOR CLEANING AND SURFACE TREATMENT

(71) Applicant: Applied Materials, Inc., Santa Clara, CA (US)

(72) Inventors: Banqiu Wu, San Jose, CA (US); Eli Dagan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/556,562

(22) Filed: Aug. 30, 2019

(65) Prior Publication Data
US 2020/0098556 A1 Mar. 26, 2020

Related U.S. Application Data

(60) Provisional application No. 62/735,594, filed on Sep. 24, 2018.

(51) Int. Cl.
*H01L 21/02* (2006.01)
*H01L 21/67* (2006.01)
*B08B 7/00* (2006.01)

(52) U.S. Cl.
CPC .......... *H01L 21/02057* (2013.01); *B08B 7/00* (2013.01); *H01L 21/67028* (2013.01); *H01L 21/67115* (2013.01)

(58) Field of Classification Search
None
See application file for complete search history.

(56) References Cited

U.S. PATENT DOCUMENTS

| 6,143,081 A * | 11/2000 | Shinriki | C23C 16/405 |
| | | | 118/715 |
| 6,507,031 B1 * | 1/2003 | Jinbo | C23C 8/10 |
| | | | 250/455.11 |

(Continued)

FOREIGN PATENT DOCUMENTS

| JP | 2000323425 A | 11/2000 | |
| JP | 2001104776 A * | 4/2001 | ........ H01L 21/67115 |

(Continued)

OTHER PUBLICATIONS

Machine Generated English Translation of the description of JP 2015-032757. Published Feb. 16, 2015 (Year: 2015).*

(Continued)

*Primary Examiner* — Sylvia MacArthur
(74) *Attorney, Agent, or Firm* — Patterson + Sheridan, LLP (57) ABSTRACT

Embodiments described herein relate to oxygen cleaning chambers and a method of atomic oxygen cleaning a substrate. The oxygen cleaning chambers and method of atomic oxygen cleaning a substrate provide for generation of atomic oxygen in situ to oxidize materials on the surfaces of the substrate. The atomic oxygen cleaning chamber includes a chamber body, a chamber lid, a processing volume defined by the chamber body and the chamber lid, an UV radiation generator including one or more UV radiation sources, a pedestal disposed in the processing volume, and a gas distribution assembly. The pedestal has a processing position corresponding to a distance from the UV radiation generator to an upper surface of the pedestal. The gas distribution assembly is configured to be connected to an ozone generator to distribute ozone over the upper surface of the pedestal.

11 Claims, 5 Drawing Sheets

(56) References Cited

U.S. PATENT DOCUMENTS

| | | | |
|---|---|---|---|
| 6,555,835 B1* | 4/2003 | Wydeven | B08B 7/0035 |
| | | | 134/1 |
| 8,911,553 B2* | 12/2014 | Baluja | H01L 21/6719 |
| | | | 156/345.34 |
| 9,805,993 B2* | 10/2017 | Rick | G01J 5/0802 |
| 9,922,889 B2* | 3/2018 | Ono | H01L 21/67115 |
| 2001/0012604 A1 | 8/2001 | Okase et al. | |
| 2001/0035131 A1* | 11/2001 | Sakuma | H01L 21/67115 |
| | | | 118/724 |
| 2003/0215751 A1* | 11/2003 | Otake | H01L 21/67115 |
| | | | 430/311 |
| 2004/0241991 A1* | 12/2004 | Aoyama | H01L 21/28202 |
| | | | 438/689 |
| 2006/0223315 A1 | 10/2006 | Yokota et al. | |
| 2011/0097902 A1 | 4/2011 | Singh et al. | |
| 2013/0068390 A1 | 3/2013 | Sanchez et al. | |
| 2013/0160946 A1 | 6/2013 | Smargiassi et al. | |
| 2014/0230861 A1* | 8/2014 | Smargiassi | H01L 21/67115 |
| | | | 239/548 |
| 2014/0273411 A1* | 9/2014 | Abedijaberi | C23C 16/45578 |
| | | | 438/478 |
| 2014/0335695 A1* | 11/2014 | Luere | H01L 21/67115 |
| | | | 156/345.34 |
| 2015/0059981 A1* | 3/2015 | Huston | C23C 16/46 |
| | | | 118/733 |
| 2015/0128990 A1* | 5/2015 | Brown | H01L 21/67115 |
| | | | 134/1 |
| 2016/0017263 A1* | 1/2016 | Duan | H01L 21/67028 |
| | | | 134/1 |
| 2018/0350595 A1* | 12/2018 | Srinivasan | H01L 21/02164 |
| 2020/0098556 A1* | 3/2020 | Wu | B08B 7/00 |

FOREIGN PATENT DOCUMENTS

| | | | | |
|---|---|---|---|---|
| JP | 2002517082 | A | | 6/2002 |
| JP | 2003047842 | A | | 2/2003 |
| JP | 2005340665 | A | | 12/2005 |
| JP | 2006114848 | A | * | 4/2006 |
| JP | 2006114848 | A | | 4/2006 |
| JP | 2010010283 | A | * | 1/2010 |
| JP | 2010010283 | A | | 1/2010 |
| JP | 2013197255 | A | | 9/2013 |
| JP | 2014022655 | A | | 2/2014 |
| JP | 2015032757 | A | | 2/2015 |
| JP | 2015103545 | A | | 6/2015 |
| JP | 2018098240 | A | | 6/2018 |
| KR | 10-0605799 | B | | 7/2006 |
| KR | 1020100033431 | A | | 3/2010 |
| KR | 1020170032173 | A | | 3/2017 |
| TW | 201203351 | A | | 1/2012 |
| WO | WO-2014158320 | A1 | * | 10/2014 ............... B08B 3/08 |

OTHER PUBLICATIONS

Taiwan Office Action issued to Application No. 108131457 dated Jun. 18, 2021.

PCT International Search Report and the Written Opinion for International Application No. PCT/US2019/048480; dated Dec. 18, 2019; 15 pages.

Japanese Office Action issued to Application No. 201-516781 dated May 2, 2022.

Japanese Office Action for Application No. 2021-516781 dated Jan. 12, 2023.

Korean Office Action issued to Application No. 10-2021-7011726 dated May 30, 2023.

Korean Office Action issued to Patent Application No. 10-2021-7011726 dated Nov. 9, 2022.

Taiwan Office Action issued to Patent Application No. 111111429 dated Jul. 5, 2022.

Korean Office Action issued to Patent Application No. 10-2021-7011726 dated Oct. 26, 2023.

* cited by examiner

Fig. 4

ATOMIC OXYGEN AND OZONE DEVICE FOR CLEANING AND SURFACE TREATMENT

CROSS-REFERENCE TO RELATED APPLICATIONS

This application claims priority to U.S. Provisional Patent Application Ser. No. 62/735,594, filed on Sep. 24, 2018, which herein is incorporated by reference.

BACKGROUND

Field

Embodiments of the present disclosure generally relate to apparatuses and methods to clean equipment. More particularly, embodiments of the present disclosure relate to oxygen cleaning chambers and method of atomic oxygen cleaning a substrate.

Description of the Related Art

In the cleaning of semiconductor devices, it is often desirable to remove contaminants from surfaces of a substrate, thus leaving clean surfaces. Absent cleaning, contaminants may be present that will negatively impact semiconductor device performance. Cleanliness of semiconductor devices, such as substrates, photomask photoresists strips, chamber components, impacts product yield, chamber uptime, and customers cost.

Most substrate cleaning techniques utilize oxygen-containing cleaning agents exposed to ultraviolet (UV) radiation to oxidize the surfaces of the substrate. Atomic oxygen compared to other oxygen-containing cleaning agents has the highest reaction rate and oxidizing capability such that the surfaces of the substrate are cleaned at a greater rate for greater throughput. However, atomic oxygen has a short lifetime and once formed will combine with $O_2$ and other molecules of the oxygen-containing cleaning agent.

Accordingly, what is needed in the art is improved oxygen cleaning chambers and a method of atomic oxygen cleaning a substrate.

SUMMARY

In one embodiment, an atomic oxygen cleaning chamber in provided. The atomic oxygen cleaning chamber includes a chamber body, a chamber lid, a processing volume defined by the chamber body and the chamber lid, an ultraviolet (UV) radiation generator including one or more UV radiation sources, a pedestal disposed in the processing volume, and a gas distribution assembly. The pedestal has a processing position corresponding to a distance from the UV radiation generator to an upper surface of the pedestal. The gas distribution assembly is operable to distribute ozone over the upper surface of the pedestal.

In another embodiment, a system in provided. The system includes one or more service chambers and one or more atomic oxygen cleaning chambers coupled to a transfer chamber. A is robot housed in the transfer chamber and is used to transfer substrates between the one or more service chambers and the one or more atomic oxygen cleaning chambers. Each of the one or more atomic oxygen cleaning chambers includes a chamber body, a chamber lid, a processing volume defined by the chamber body and the chamber lid, an ultraviolet (UV) radiation generator including one or more UV radiation sources, a pedestal disposed in the processing volume, and a gas distribution assembly. The pedestal has a processing position corresponding to a distance from the UV radiation generator to an upper surface of the pedestal. The gas distribution assembly is operable to distribute ozone over the upper surface of the pedestal.

In yet another embodiment a method of atomic oxygen cleaning a substrate is provided. The method includes positioning a substrate having one or more surfaces on an upper surface of a pedestal disposed in a processing volume of an atomic oxygen cleaning chamber. The upper surface of the pedestal is a distance from an ultraviolet (UV) radiation generator of the atomic oxygen cleaning chamber. A first surface of the one or more surfaces is oriented toward the UV radiation generator. Ozone is flowed into the processing volume and ozone is distributed across the first surface of the substrate. Radiation is discharged at about 240 nanometers (nm) to about 310 nm wavelength from the UV generator towards the ozone.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to oxygen cleaning chambers and a method of atomic oxygen cleaning a substrate. The oxygen cleaning chambers and method of atomic oxygen cleaning a substrate provide for generation of atomic oxygen in situ to oxidize materials on the surfaces of the substrate.

Figure 1A:
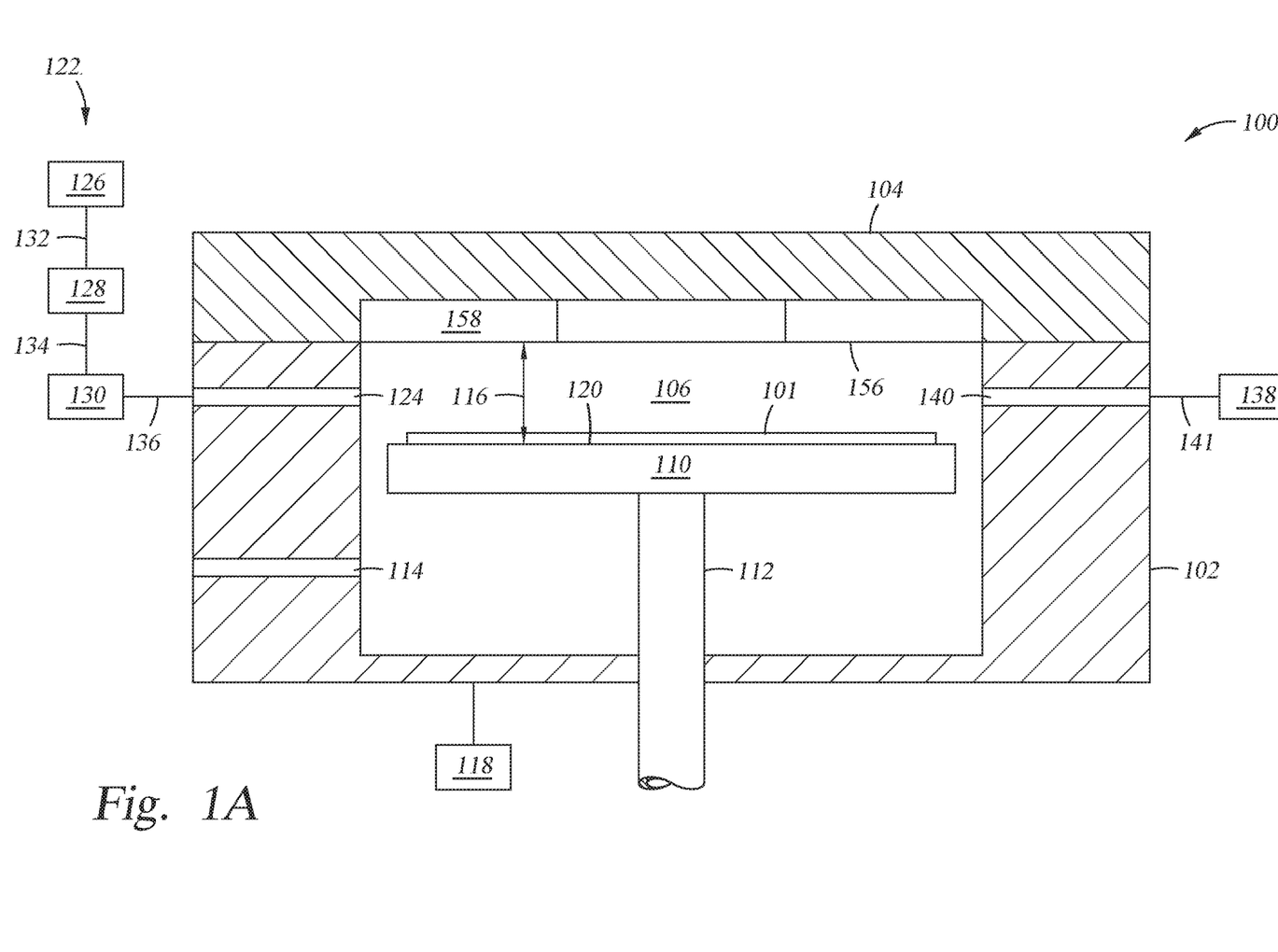
FIG. 1A is a schematic cross-sectional view of an atomic oxygen cleaning chamber according an embodiment described herein.

FIG. 1A is a schematic cross-sectional view of atomic oxygen cleaning chamber 100. In one embodiment, the atomic oxygen cleaning chamber 100 is utilized for a method 400 of atomic oxygen cleaning a substrate. The atomic oxygen cleaning chamber 100 has a chamber body 102 and a chamber lid 104. The atomic oxygen cleaning chamber 100 includes a processing volume 106. The processing volume 106 is the space defined by the chamber body 102 and the chamber lid 104. The processing volume 106 has the pedestal 110 for supporting a substrate 101 within the atomic oxygen cleaning chamber 100. The pedestal 110 is supported by a stem 112. The pedestal 110 is movably disposed in the processing volume 106 by a stem 112 which extends through the chamber body 102 where stem 112 is connected to a lift system (not shown) that moves the pedestal 110 between a processing position (as shown) and a transfer position that facilitates substrate transfer to and from the processing volume 106 through a slit valve 114 formed though the chamber body 102. The processing position corresponds to a distance 116 from an ultraviolet (UV) radiation generator 156 to an upper surface 120 of the pedestal 110.

As shown in FIG. 1A, the atomic oxygen cleaning chamber 100 includes a gas distribution assembly 122. The gas distribution assembly 122 includes a gas inlet 124, an oxygen-containing gas source 126, an ozone ($O_3$) generator 128, and a flow controller 130. The ozone generator 128 is in fluid communication with an oxygen-containing gas source 126 via a first conduit 132. The ozone generator 128 is capable of generating ozone from the oxygen-containing gas and sustaining the ozone at a pressure and concentration. The flow controller 130, such as a mass flow control (MFC) device, in fluid communication with the ozone generator via a second conduit 134 controls a flow rate of ozone from the ozone generator 128. The atomic oxygen cleaning chamber 100 includes a controller 118. The controller 118 includes a central processing unit (CPU), a memory, and support circuits for the CPU. The controller 118 enables control of the operating parameters and operations, such as a method 400 of atomic oxygen cleaning a substrate 101, for the atomic oxygen cleaning chamber 100.

Figure 1B:
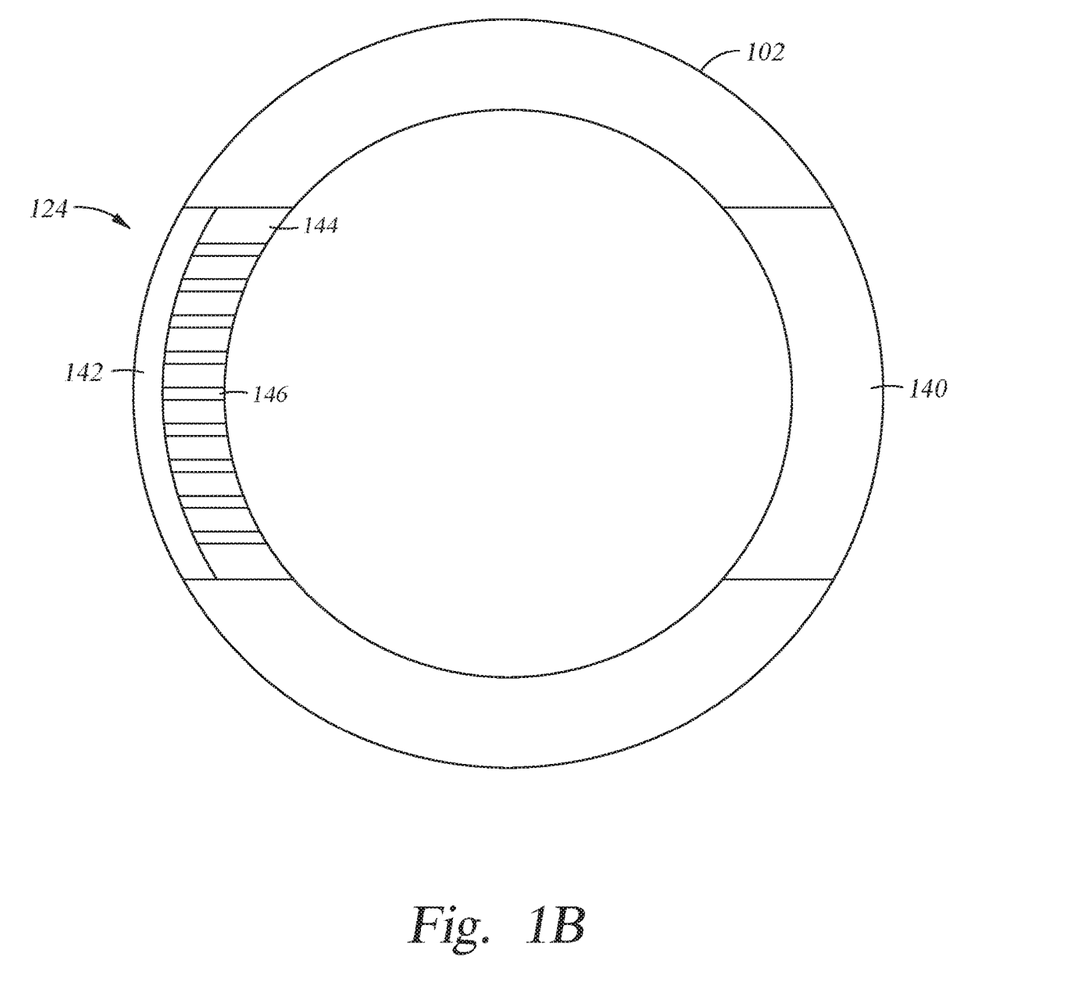
FIG. 1B is a schematic sectional view of the chamber body of an atomic oxygen cleaning chamber according to an embodiment described herein.

FIG. 1B is a schematic sectional view of the chamber body 102 having gas inlet 124 and gas outlet 140. The gas inlet 124 includes a manifold 142 and a flow guide 144. The manifold 142 is connected to the ozone generator 128 via a third conduit 136. The flow of ozone distributes across the manifold 142, flows through a plurality of channels 146 of the flow guide 144, and distributes over the upper surface 120 of the pedestal 110. The gas outlet 140 is disposed in the chamber body 102. Referring to FIG. 1A, the UV radiation generator 156 includes one or more UV radiation sources 158 coupled to the chamber lid 104. In one embodiment, which can be combined with other embodiments described herein, at least one of the UV radiation sources 158 is a low pressure mercury lamp. A pump 138 is coupled to the gas outlet 140 for controlling the pressure within the processing volume 106 and exhausting byproducts from the processing volume 106 through the gas outlet 140 via a fourth conduit 141.

Figure 2:
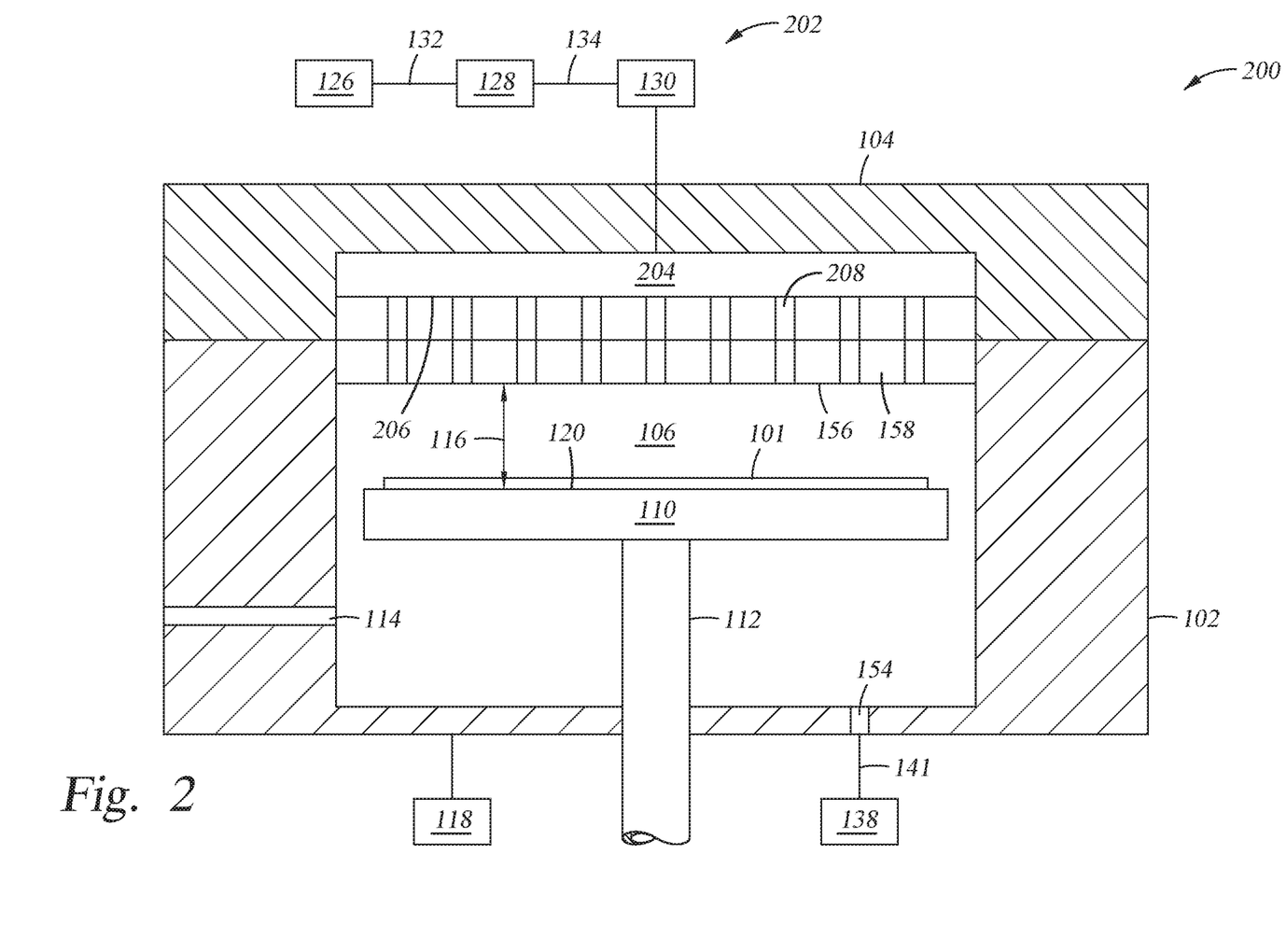
FIG. 2 is a schematic cross-sectional view of an atomic oxygen cleaning chamber according to an embodiment described herein.

FIG. 2 is a schematic cross-sectional view of an atomic oxygen cleaning chamber 200 according to one embodiment. The atomic oxygen cleaning chamber 200 includes a gas distribution assembly 202. The gas distribution assembly 202 includes the oxygen-containing gas source 126, the ozone ($O_3$) generator 128, and the flow controller 130. In addition, as shown in FIG. 2, the gas distribution assembly 202 includes a plenum 204 formed in the chamber lid 104 and a showerhead 206 coupled the plenum 204. The showerhead 206 has a plurality of channels 208. The flow of ozone distributes across the plenum 204, flows through a plurality of channels 208 of the showerhead 206, and distributes over the upper surface 120 of the pedestal 110. The UV radiation generator 156 including one or more UV radiation sources 158 is coupled to the showerhead 206. In one embodiment, which can be combined with other embodiments described herein, at least one of the UV radiation sources 158 is a low pressure mercury lamp. A pump 138 is coupled to an outlet 154 of the chamber body 102 for controlling the pressure within the processing volume 106 and exhausting byproducts from the processing volume 106 via a fourth conduit 141. The controller 118 enables control of the operating parameters and operations, such as a method 400 of atomic oxygen cleaning a substrate 101, for the atomic oxygen cleaning chamber 200.

Referring to FIG. 1A and FIG. 2, the UV radiation generator 156 includes one or more UV radiation sources 158 that generate UV radiation. The UV radiation sources 158 may be lamps, LED emitters, or other UV emitters configured to discharge radiation at about 240 nm to about 310 nm wavelength. Ozone distributed over the surface of the substrate 101 is exposed to the radiation and converted to oxygen gas ($O_2$) and atomic oxygen (O). The oxygen gas and atomic oxygen oxidize inorganic materials, such as hydrocarbons, on the surface of the substrate 101 producing carbon dioxide ($CO_2$) and water ($H_2O$) as byproducts. The pump 138 exhausts the byproducts from the processing volume 106.

Atomic oxygen compared to other oxygen-containing cleaning agents has the highest reaction rate and oxidizing capability such that the surface of the substrate 101 cleaned at a greater rate for greater throughput. One example is that atomic oxygen can oxidize $SO_2$ to $SO_3$ instantly on the surface of the substrate 101, and thus $SO_3$ may be cleaned by a following water-based cleaning step easily. The removal of $SO_2$ by atomic oxygen cleaning the substrate 101 slows down haze defect accumulation. However, atomic oxygen has a short lifetime and once formed will combine with $O_2$ and other molecules. The ozone generator 128 is capable of continuously providing ozone to the processing volume 106 such that radiation generated by the UV radiation generator 156 converts the ozone into atomic oxygen in situ. In situ atomic oxygen generation in the processing volume provides a high concentration of atomic oxygen to the surface of the substrate 101. The distance 116 from the UV radiation generator 156 to the upper surface 120 of the pedestal 110 controls the concentration of atomic oxygen provided to the surface of the substrate 101.

Figure 3:
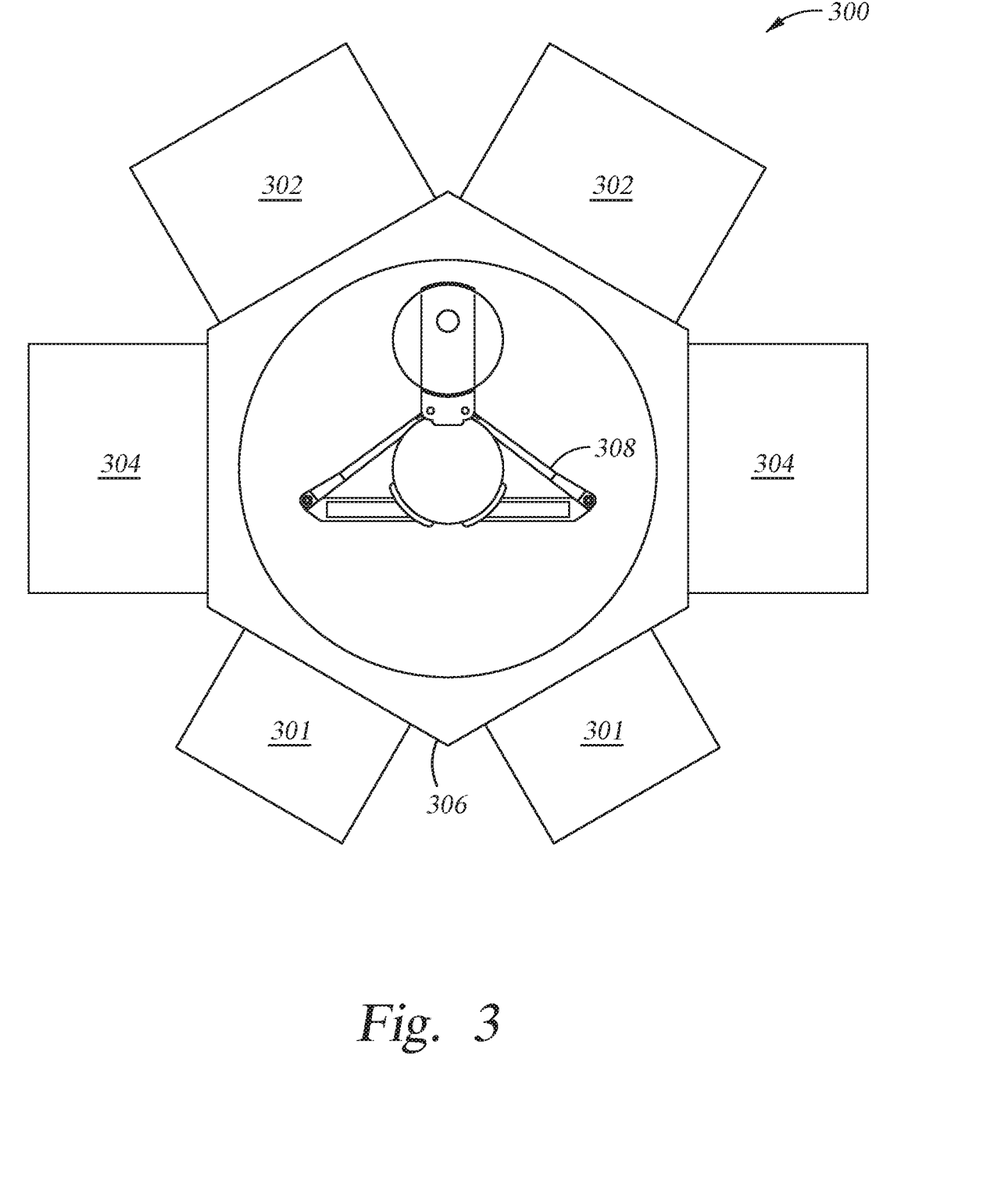
FIG. 3 is a schematic view of a system according to an embodiment described herein.

FIG. 3 is a schematic view of a system 300 utilized for the method 400 of atomic oxygen cleaning a substrate. It is to be understood that the system described below is an exemplary system and other systems, including systems from other manufacturers, may be used with or modified to accomplish aspects of the present disclosure. The system 300 includes one or more service chambers 304, and one or more of atomic oxygen cleaning chambers 301 coupled to a transfer chamber 306. In another embodiment, the system 300 includes one or more processing chambers 302 coupled to the transfer chamber 306. The one or more service chambers 304 are adapted for at least one of degassing, orientation, cool down, pretreatment/preclean, post-anneal, and the like. The one or more processing chambers 302 are adapted for at least one of rapid thermal processing (RTP), an epitaxial (EPI) deposition, a chemical vapor deposition (CVD), a plasma enhanced chemical vapor deposition (PECVD), a physical vapor deposition (PVD), and the like. The transfer chamber 306 houses a robot 308 used to transfer substrates between the service chambers 304, processing chambers 302, and atomic oxygen cleaning chambers 301.

Figure 4:
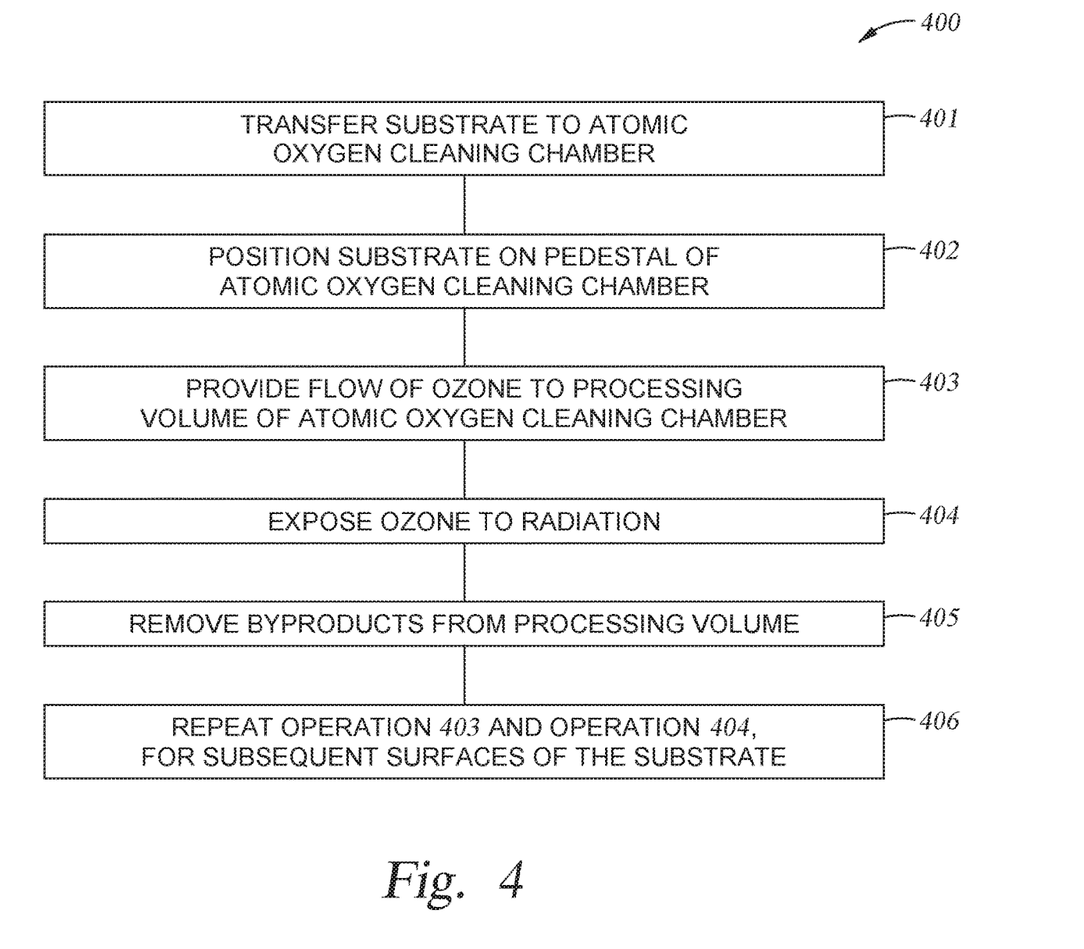
FIG. 4 is a flow diagram of a method of atomic oxygen cleaning a substrate according to an embodiment described herein.

FIG. 4 is a flow diagram of a method 400 of atomic oxygen cleaning a substrate. To facilitate explanation, FIG. 4 will be described with reference to FIGS. 1A, FIG. 1B, and FIG. 2. However, it is to be noted that atomic oxygen cleaning chambers other than the atomic oxygen cleaning chamber 100 and the atomic oxygen cleaning chamber 200 may be utilized in conjunction with method 400 and it is to be noted that systems other than the system 300 may be utilized in conjunction with method 400.

At optional operation 401, a substrate 101 is transferred to an atomic oxygen cleaning chamber 301. In one embodiment, which can be combined with other embodiments described herein, the atomic oxygen cleaning chamber 301 is the atomic oxygen cleaning chamber 100. In another embodiment, which can be combined with other embodiments described herein, the atomic oxygen cleaning chamber 301 is the atomic oxygen cleaning chamber 200. In one embodiment, which can be combined with other embodiments described herein, a robot 308 of the system 300 transfers the substrate 101 from a processing chamber 302 or a service chamber 304 to the atomic oxygen cleaning chamber 301. At operation 402, which can be combined with other embodiments described herein, the substrate 101 is positioned on the pedestal 110. A first surface of the substrate 101, having one or more surfaces, is oriented towards the UV radiation generator 156. In one embodiment, which can be combined with other embodiments described herein, a distance 116 from the ultraviolet (UV) radiation generator 156 to an upper surface 120 of the pedestal 110 is about 7 millimeters (mm) to about 30 mm. At operation 403, a flow of ozone is provided to the processing volume 106. In one embodiment, the ozone gas is flowed into the processing volume 106 at a rate of about 50 sccm to about 20000 sccm. In another embodiment, which can be combined with other embodiments described herein, the pressure in the atomic oxygen cleaning chamber 301 is about 0 psi to about 15 psi. The flow of ozone distributes over the first surface of the substrate 101 in the processing volume 106. At operation 404, the UV radiation generator 156 discharges radiation. The flow of ozone distributed over the first surface of the substrate 101 in the processing volume 106 is exposed to the radiation and converted to oxygen gas ($O_2$) and atomic oxygen (O). The oxygen gas and atomic oxygen oxidize organic materials, such as hydrocarbons, on the first surface of the substrate 101 producing carbon dioxide ($CO_2$) and water ($H_2O$) as byproducts. At operation 405, the byproducts are removed from the processing volume 106. At optional operation 406, operation 403 and operation 404 are repeated for subsequent surfaces of the substrate 101. At the conclusion of the method 400, the robot 308 of the system 300 may transfer the substrate 101 from the atomic oxygen cleaning chamber 301 to the processing chamber 302 or the service chamber 304.

In summation, atomic oxygen cleaning chambers and method of atomic oxygen cleaning a substrate are described herein. Atomic oxygen compared to other oxygen-containing cleaning agents has the highest reaction rate and oxidizing capability such that the surface of the substrate is cleaned at a greater rate for greater throughput. Each atomic oxygen cleaning chamber includes an ozone generator that continuously provides ozone to the processing volume such that radiation generated by the UV radiation generator converts the ozone into atomic oxygen in situ. In situ atomic oxygen generation in the processing volume provides a high concentration of atomic oxygen to the surface of the substrate.

While the foregoing is directed to examples of the present disclosure, other and further examples of the disclosure may be devised without departing from the basic scope thereof, and the scope thereof is determined by the claims that follow.

What is claimed is:

1. An atomic oxygen cleaning chamber, comprising:
   a chamber body having a gas inlet disposed in a first sidewall in the chamber body and a gas outlet disposed in a second sidewall of the chamber, wherein the first sidewall and the second sidewall are on opposite sides of the chamber body;
   a chamber lid coupled to and disposed on the chamber body;
   a processing volume defined by the chamber body and an underside of the chamber lid, the gas inlet open to the processing volume;
   an ultraviolet (UV) radiation generator including one or more UV radiation sources disposed in the processing volume below the chamber lid;
   a pedestal disposed in the processing volume, the pedestal having a processing position corresponding to a distance from the UV radiation generator to an upper surface of the pedestal, the pedestal in the processing position is below the gas inlet; and
   a gas distribution assembly operable to distribute ozone laterally across the upper surface of the pedestal from the gas inlet of the chamber body laterally to the gas outlet of the chamber body, the one or more UV radiation sources disposed between the gas inlet and the underside of the chamber lid in the processing volume.

2. The chamber of claim 1, wherein a flow guide is disposed in the gas inlet, the flow guide having a plurality of channels to distribute ozone over the upper surface of the pedestal.

3. The chamber of claim 1, wherein the one or more UV radiation sources are configured to discharge radiation at about 240 nanometers (nm) to about 310 nm wavelength.

4. The chamber of claim 1, the pedestal is coupled to a stem operable to move the pedestal between the processing position and a transfer position.

5. The atomic oxygen cleaning chamber of claim 1, wherein the pedestal and the UV radiation sources are disposed in a same processing volume.

6. A system comprising:
   one or more service chambers and one or more atomic oxygen cleaning chambers coupled to a transfer chamber; and
   a robot housed in the transfer chamber used to transfer substrates between the one or more service chambers and the one or more atomic oxygen cleaning chambers, each of the one or more atomic oxygen cleaning chambers comprises:
     a chamber body having a gas inlet disposed in a first sidewall in the chamber body and a gas outlet disposed in a second sidewall in the chamber body, wherein the first sidewall and the second sidewall are on opposite sides of the chamber body;
     a chamber lid coupled to and disposed above the chamber body;
     a processing volume defined by the chamber body and an underside of the chamber lid, the gas inlet open to the processing volume;
     an ultraviolet (UV) radiation generator including one or more UV radiation sources disposed in the processing volume below the chamber lid;
     a pedestal disposed in the processing volume, the pedestal having a processing position corresponding to a distance from the UV radiation generator to an upper surface of the pedestal, the pedestal in the processing position is below the gas inlet; and a gas distribution assembly operable to distribute ozone laterally across the upper surface of the pedestal from the gas inlet of the chamber body laterally to the gas outlet of the chamber body, the one or more UV radiation sources disposed between the gas inlet and the underside of the chamber lid in the processing volume.

7. The system of claim 6, a flow guide is disposed in the gas inlet, the flow guide having a plurality of channels to distribute ozone over the upper surface of the pedestal.

8. The system of claim 6, wherein the one or more UV radiation sources are configured to discharge radiation at about 240 nanometers (nm) to about 310 nm wavelength.

9. The system of claim 6, the pedestal is coupled to a stem operable to move the pedestal between the processing position and a transfer position.

10. The system of claim 6, wherein one or more service chambers are adapted for at least one of a degassing, orientation, cool down, pretreatment, precleaning, and post-annealing process.

11. The system of claim 6, wherein the pedestal and the UV radiation sources are disposed in a same processing volume.

* * * * *